(12) United States Patent
Molinero-Giles et al.

(10) Patent No.: US 10,640,362 B2
(45) Date of Patent: May 5, 2020

(54) SYSTEMS, DEVICES, AND METHODS FOR REDUCING SURFACE DIELECTRIC CHARGING IN A RF MEMS ACTUATOR ELEMENT

(71) Applicant: wiSpry, Inc., Irvine, CA (US)

(72) Inventors: David Molinero-Giles, Irvine, CA (US); Shawn J. Cunningham, Irvine, CA (US); Dana DeReus, Santa Ana, CA (US)

(73) Assignee: WISPRY, INC., Irvine, CA (US)

( * ) Notice: Subject to any disclaimer, the term of this patent is extended or adjusted under 35 U.S.C. 154(b) by 1303 days.

(21) Appl. No.: 14/676,488

(22) Filed: Apr. 1, 2015

(65) Prior Publication Data

US 2015/0279602 A1 Oct. 1, 2015

Related U.S. Application Data

(60) Provisional application No. 61/973,813, filed on Apr. 1, 2014.

(51) Int. Cl.
*B81B 3/00* (2006.01)
*H01H 59/00* (2006.01)

(52) U.S. Cl.
CPC .......... *B81B 3/001* (2013.01); *B81B 3/0008* (2013.01); *B81B 3/0086* (2013.01);
(Continued)

(58) Field of Classification Search
CPC ..... B81B 3/001; B81B 3/0051; B81B 3/0056; B81B 2201/0221; B81B 2203/04;
(Continued)

(56) References Cited

U.S. PATENT DOCUMENTS 7,005,596 B2  2/2006 Maeda et al.
7,321,275 B2  1/2008 Chou et al.
(Continued)

FOREIGN PATENT DOCUMENTS

CN  1613154 A  5/2005
CN  1885469 A  12/2006
(Continued)

OTHER PUBLICATIONS

International Search Report for Application No. PCT/US 2015/023907 dated Jun. 29, 2015.
(Continued)

*Primary Examiner* — Jermele M Hollington
*Assistant Examiner* — Alexander A Singh
(74) *Attorney, Agent, or Firm* — Jenkins, Wilson, Taylor & Hunt, P.A.

(57) ABSTRACT

The present subject matter relates to systems, devices, and methods for reducing surface dielectric charging in a RF MEMS actuator element. In particular, a micro-electro-mechanical systems (MEMS) can comprise a fixed electrode positioned on a substrate, a moveable electrode positioned substantially above the fixed electrode and separated from the fixed electrode by a gap, and at least one standoff bump positioned between the fixed electrode and the moveable electrode, wherein the at least one standoff bump extends into the gap. In this configuration, one or both of the fixed electrode or the moveable electrode can be patterned to define one or more hole that is substantially aligned with the one or more of the at least one standoff bump. The bump and the hole can both help to reduce the rate of surface dielectric charging and the total amount of charge generated.

21 Claims, 14 Drawing Sheets

(52) U.S. Cl.
CPC ...... *B81B 2203/04* (2013.01); *H01H 59/0009* (2013.01); *H01H 2059/0018* (2013.01); *H01H 2059/0072* (2013.01)

(58) Field of Classification Search
CPC ............ B81B 2203/053; B81B 3/0008; B81B 3/0016; B81B 3/0086; H01G 4/1227; H01G 5/18; H01G 5/16; H01G 7/00; B81C 1/00166; B81C 1/00476; B81C 2201/0221; B81C 2201/013; B81C 2201/0109; H01H 2059/0072; H01H 2059/0018; H01H 59/0009
See application file for complete search history.

(56) References Cited

U.S. PATENT DOCUMENTS

| | | | |
|---|---|---|---|
| 8,420,427 | B2 | 4/2013 | Cunningham et al. |
| 8,973,250 | B2 | 3/2015 | Jahnes et al. |
| 2002/0018334 | A1* | 2/2002 | Hill .......................... F03G 7/06 361/278 |
| 2003/0116417 | A1* | 6/2003 | DeReus ................ B81B 3/0024 200/181 |
| 2003/0146079 | A1 | 8/2003 | Goldsmith |
| 2006/0290443 | A1 | 12/2006 | Chou et al. |
| 2006/0291135 | A1* | 12/2006 | Musalem ................. H01G 5/04 361/283.4 |
| 2007/0040637 | A1 | 2/2007 | Yee et al. |
| 2008/0239455 | A1* | 10/2008 | Kogut .................. G02B 26/001 359/291 |
| 2008/0283943 | A1 | 11/2008 | Dekker et al. |
| 2013/0119822 | A1 | 5/2013 | Mao et al. |

FOREIGN PATENT DOCUMENTS

| | | |
|---|---|---|
| CN | 101309854 A | 11/2008 |
| CN | 102275857 A | 12/2011 |
| CN | 106463311 B | 1/2019 |
| EP | 3127133 A1 | 2/2017 |
| JP | 2004074341 A | 3/2004 |
| JP | 2009516346 A | 4/2009 |
| WO | WO-2012177371 A1 * 12/2012 ............ B81B 3/001 |
| WO | WO 2015/153781 A1 | 10/2015 |

OTHER PUBLICATIONS

European Notice of Publication for Application No. 15773541 dated Jan. 11, 2017.
Extended European Search Report for Application No. 15773541 dated Nov. 2, 2017.
Chinese Office Action for Chinese Application No. 2015800178308 dated Dec. 5, 2017.

* cited by examiner

SYSTEMS, DEVICES, AND METHODS FOR REDUCING SURFACE DIELECTRIC CHARGING IN A RF MEMS ACTUATOR ELEMENT

PRIORITY CLAIM

The present application claims the benefit of U.S. Provisional Patent Application Ser. No. 61/973,813, filed Apr. 1, 2014, the disclosure of which is incorporated herein by reference in its entirety.

TECHNICAL FIELD

The subject matter disclosed herein relates generally to radio frequency micro-electro-mechanical systems (RF MEMS) actuator devices, systems, and methods. More particularly, the subject matter disclosed herein relates to the design of dielectric contact surfaces between movable elements of RF MEMS actuator devices, systems, and methods.

BACKGROUND

The increase of mobile communication has driven the already busy and complex radio signal spectrum to a new level to accommodate the massive transfer of voice and data desired by the market. To operate within such a saturated spectrum, tunable filters are desirable to maintain optimal signal strength values. In particular, RF MEMS can help to provide high linearity performance, high quality factor, and long lifetime, making such devices useful in a wide range of mobile handset applications.

Continued data communication increases over a wide range of bands in the radio spectrum are leading to increasing number of tuning events over the life of the handsets, which will require extended and improved tunable lifetime. One of the main reliability issues of conventional RF MEMS switches and other MEMS electrostatic actuators, however, is dielectric charging. The high electrostatic field needed to close the switch generates charge inside the dielectric layers, which can cause undesired drift of the switch characteristic. This effect can deteriorate the tuning performance of the device and can lead to an irrecoverable stiction in extreme cases.

The origin of such dielectric charging varies depending on the location, type of contact, and mechanism involved. For instance, charging can occur in the dielectric bulk through injection from the electrodes into the dielectric with relatively quick charge/discharge dynamics. In other situations, surface charging can depend on the type of contact used. Specifically, metal-dielectric contacts can produce surface charge by injection when the switch is actuated, whereas triboelectric effects can be the main mechanism when two dielectrics are in contact, where charge exchange can occur between dielectrics without injection from the metal due to both dielectric thicknesses. In addition, many parameters can contribute to surface dielectric charging, such as the dielectric materials used, the fabrication process, and the ambient operating conditions. Even in structures where bulk charging is minimal, surface charging by triboelectric effects can have an important role, being the key factor limiting the switch lifetime.

In any case, charging is generally a fast mechanism when the switch is actuated under high voltage, but discharge can be comparatively slow when the voltage is removed. Once the surface charge is created and the contact is broken after removing the applied voltage, the only way for the charge to dissipate is through diffusion across the thickness of the dielectric, which can be particularly slow because of the generally low bulk diffusivity in high-quality dielectric materials. As a result, surface charging can be particularly detrimental because once the charge is generated on the surface, it cannot be removed, and cumulative deterioration can take place.

Accordingly, it would be desirable for MEMS switch systems, devices, and methods for the construction thereof to be particularly designed to reduce the amount of charging that occurs.

SUMMARY

In accordance with this disclosure, systems, devices, and methods for reducing surface dielectric charging in a RF MEMS actuator element are provided. In one aspect, a micro-electro-mechanical systems (MEMS) component is provided. The MEMS component can comprise a fixed electrode positioned on a substrate, a moveable electrode positioned substantially above the fixed electrode and separated from the fixed electrode by a gap, and at least one standoff bump positioned between the fixed electrode and the moveable electrode, wherein the at least one standoff bump extends into the gap. In this configuration, one or both of the fixed electrode or the moveable electrode can be patterned to define one or more hole that is substantially aligned with the one or more of the at least one standoff bump.

In a particular aspect, the MEMS component can comprise a fixed electrode positioned on a substrate, a moveable electrode positioned substantially above the fixed electrode and separated from the fixed electrode by a gap, and at least one standoff bump positioned between the fixed electrode and the moveable electrode, wherein the at least one standoff bump extends into the gap. In this configuration, the moveable electrode can be patterned to define one or more hole that is substantially aligned with one or more of the at least one standoff bump, the hole having a dimension that is larger than a width of the at least one standoff bump but smaller than a maximum gap spacing between the fixed electrode and the movable electrode.

In yet another aspect, a method for forming a MEMS component is provided, the method comprising depositing a fixed electrode on a substrate, depositing a sacrificial layer over the fixed electrode, and etching the sacrificial layer to define at least one standoff cavity over the fixed electrode. One or more movable dielectric layers can be deposited over the sacrificial layer, wherein at least one standoff bump is defined in the at least one standoff cavity, and a movable electrode can be deposited over the one or more movable dielectric layers. The method can further comprise etching the movable electrode to define one or more hole that is substantially aligned with one or more of the at least one standoff bump and removing the sacrificial layer such that the one or more movable dielectric layers and the movable electrode are spaced apart from the fixed electrode by a gap.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides systems, devices, and methods for reducing dielectric charging in a RF MEMS actuator element with minimal impact on actuation behavior. Triboelectric effects have been studied for centuries, and although the physical mechanism involved on the charge exchange is not always known, it is understood that ion or electron transfer at contact can lead to charge generation in MEMS switches and other actuators. Regardless of whether electrons or ions are present in the charge exchange, the triboelectric effect is strongly proportional to the area of contact, and the associated energy to transfer ions or electrons is proportional to the electric field. Therefore, either or both of these parameters can be minimized to reduce the rate of charging and the total amount of charge generated, with the consequential lifetime increase.

Figure 1A:
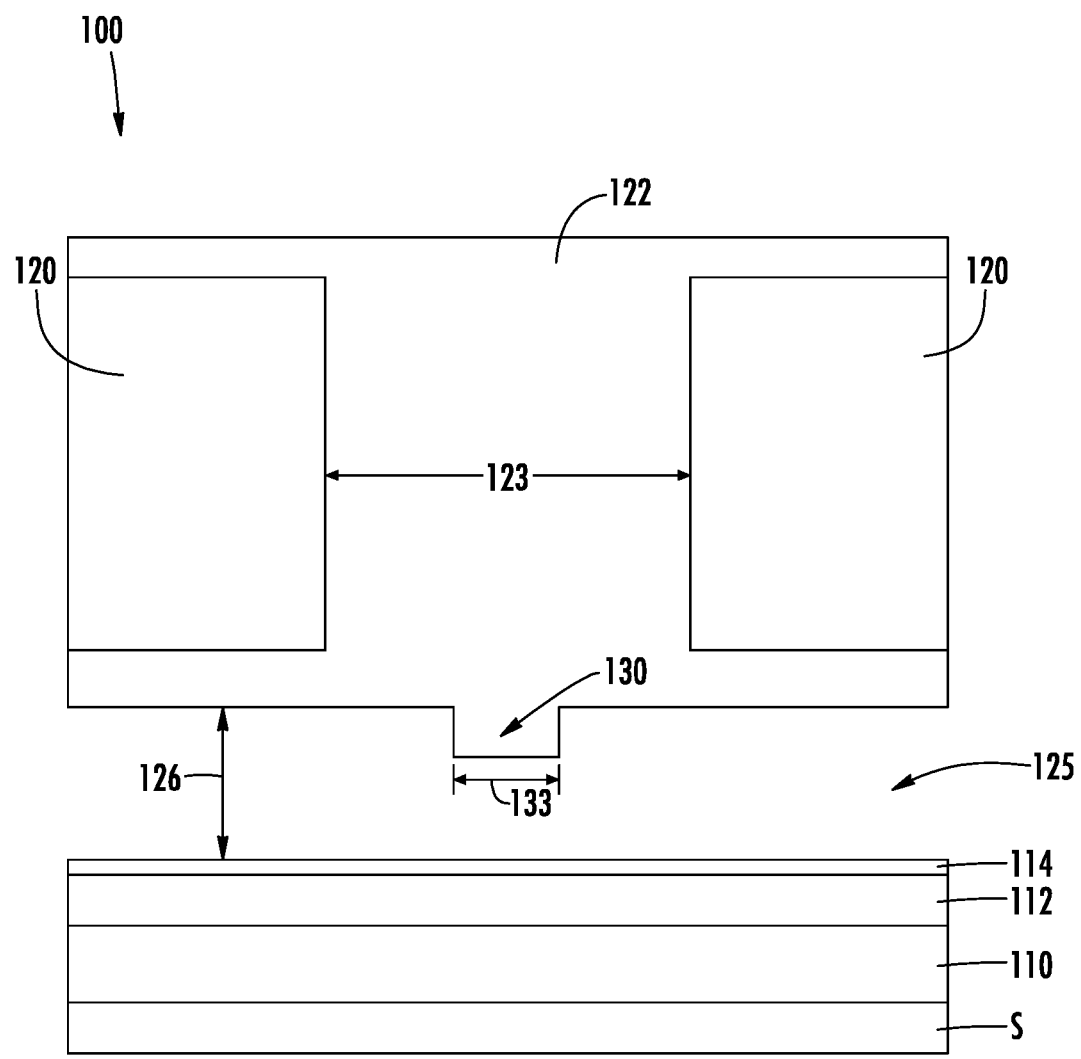
FIGS. 1a and 1b are side cutaway views of a MEMS actuator element having a standoff bump having a size relative to the surrounding material that is optimized to reduce dielectric charging according to an embodiment of the presently disclosed subject matter.
Figure 1B:
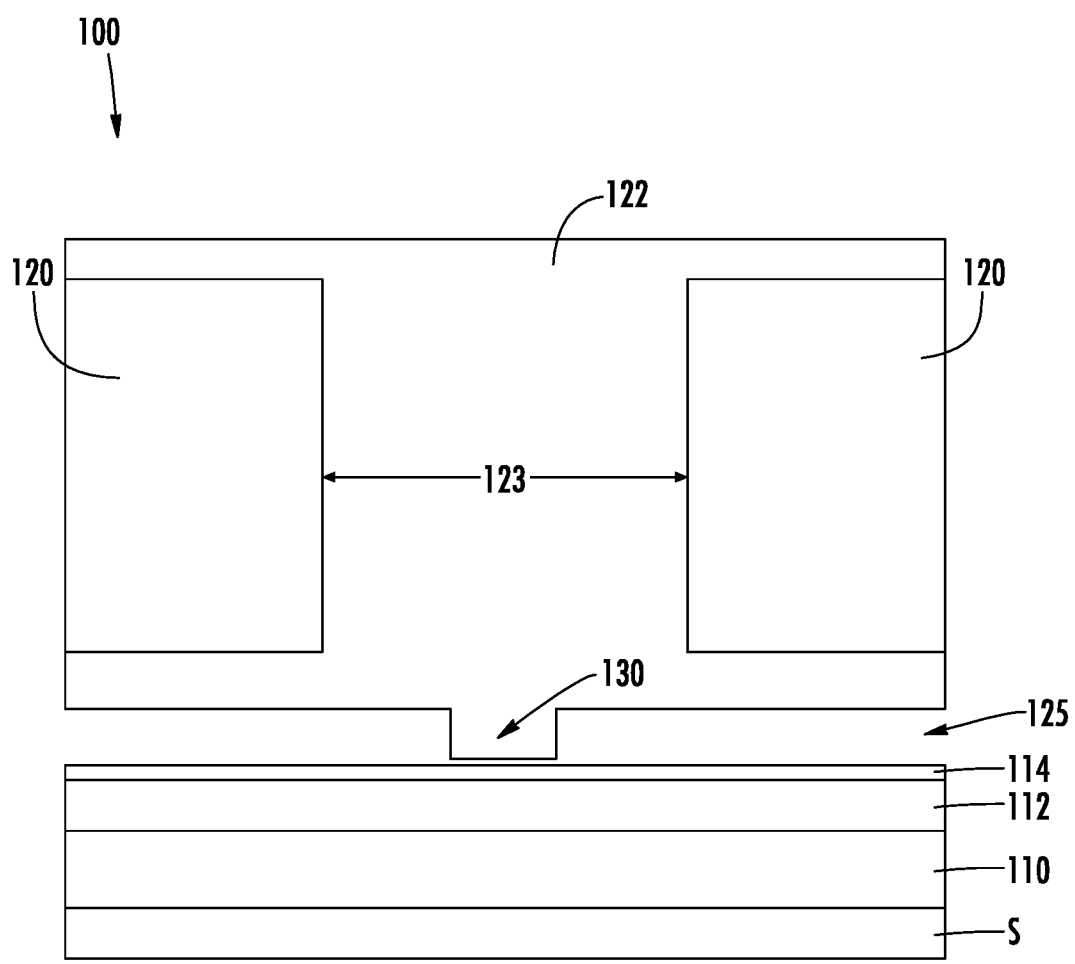
Figure 1C:
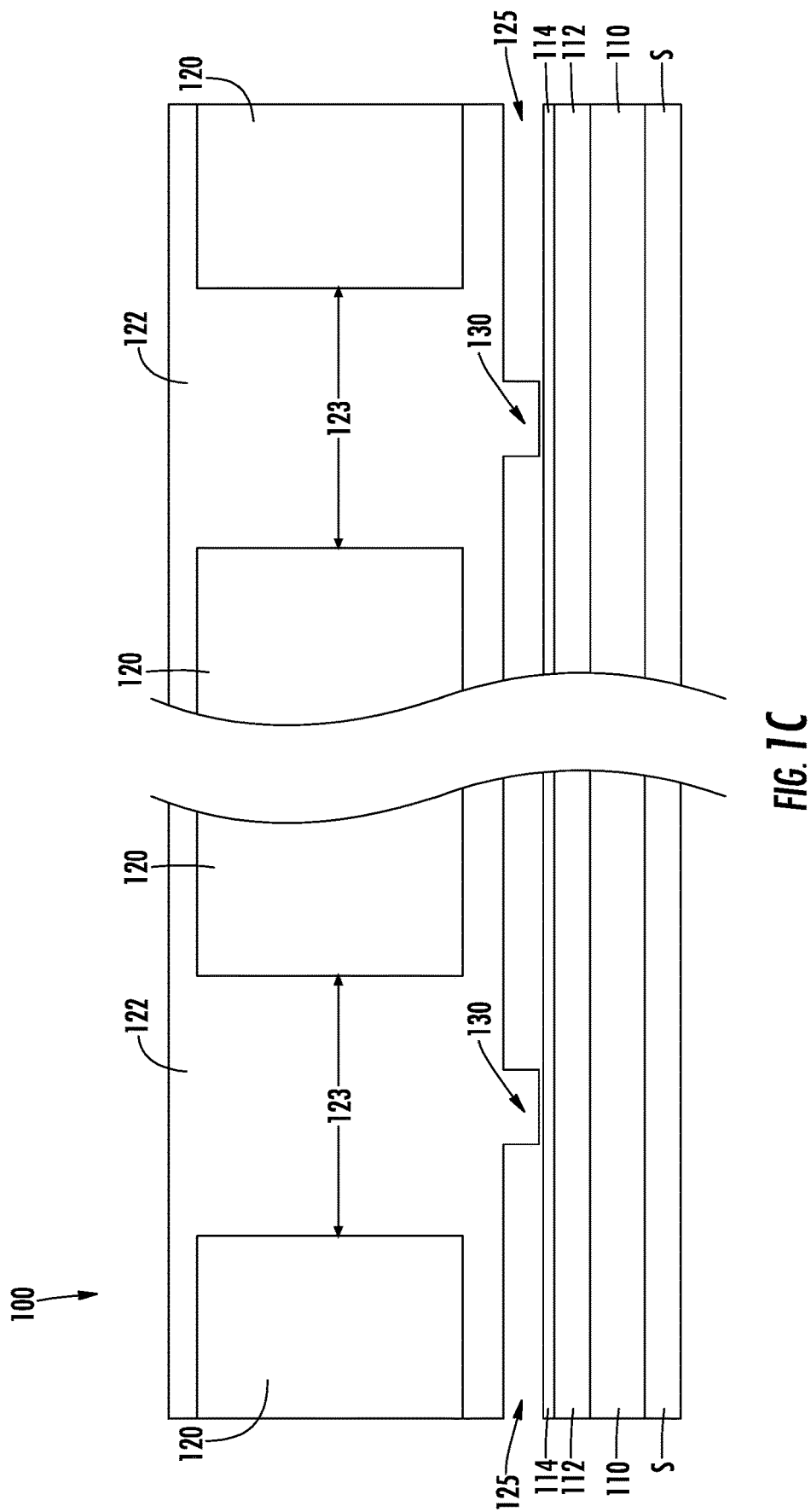
FIG 1c is a side cutaway view of a MEMs actuator element, like the one shown in FIG. 1b, but having a plurality of standoff bumps.

Accordingly, in one aspect, the present subject matter provides systems, devices, and methods to reduce the amount of charging by the inclusion of spatially distributed bumpers, which can be associated with a patterned metal and which can reduce the electric field in the area of contact. As shown in FIG. 1, for example, an exemplary configuration for a MEMS actuator element, generally designated 100, is shown. Although not shown in the Figures, MEMS actuator element 100 can be implemented as an element of a tunable capacitor or any of a variety of other kinds of MEMS structures. In any configuration, MEMS actuator element 100 can include a fixed electrode 110 positioned on a substrate S. A movable electrode 120 is spaced apart from fixed electrode 110 by a gap 125 (e.g., an air gap) by a maximum gap spacing 126 (See, e.g., FIG. 1a) but is movable with respect to fixed electrode 110 to an actuated position in which it is moved closer to or into contact with fixed electrode 110 (See, e.g., FIG. 1b). In particular for example, movable electrode 120 can be carried on a movable beam structure (e.g., a cantilever beam) that is suspended over fixed electrode 110. Further in this regard, although only fixed electrode 110, movable electrode 120, and those elements that immediately surround these material layers are shown in FIGS. 1a and 1b, those having skill in the art will recognize that the illustrated structures can be incorporated into larger structures having one or more additional material layers or elements attached or otherwise connected thereto.

In addition, to prevent direct contact of the electrodes with each other and/or with other surrounding structures, one or more dielectric material layers can be provided on either or both of fixed electrode 110 and/or movable electrode 120. In particular, for example, fixed electrode 110 can be covered by one or more of a first fixed dielectric layer 112 (e.g., a $SiO_2$ material layer), a second fixed dielectric layer 114 (e.g., a $Al_2O_3$ material layer), and/or other material layers or coatings. Similarly, movable electrode 120 can be coupled to and/or surrounded by a movable dielectric 122. Specifically, for example, movable electrode 120 can be sandwiched between layers of movable dielectric 122 as part of a movable beam structure that is suspended over fixed electrode 110.

At least in part to address the issue of surface dielectric charging, one or more standoff bump 130 can be provided between fixed electrode 110 and movable electrode 120. As shown in FIGS. 1a and 1b, for example, bump 130 can be formed as a protrusion from movable dielectric 122 that extends toward fixed electrode 110 from movable electrode 120. In one particular configuration, for example, bump 130 can be between about 38 nm to 500 nm tall (e.g., about 65 nm tall) and between 100 nm and 2000 nm wide (e.g. about 400 nm wide). In some embodiments, a plurality of bumps (e.g., see FIG. 1c) can be provided between fixed electrode 110 and movable electrode 120 in a spaced arrangement (e.g., an array of bumps arranged at a spacing of about 3300 nm from each other). In some embodiments, bump 130 can be made of the same dielectric material (e.g., $SiO_2$) that is under movable electrode 120.

Figure 2A:
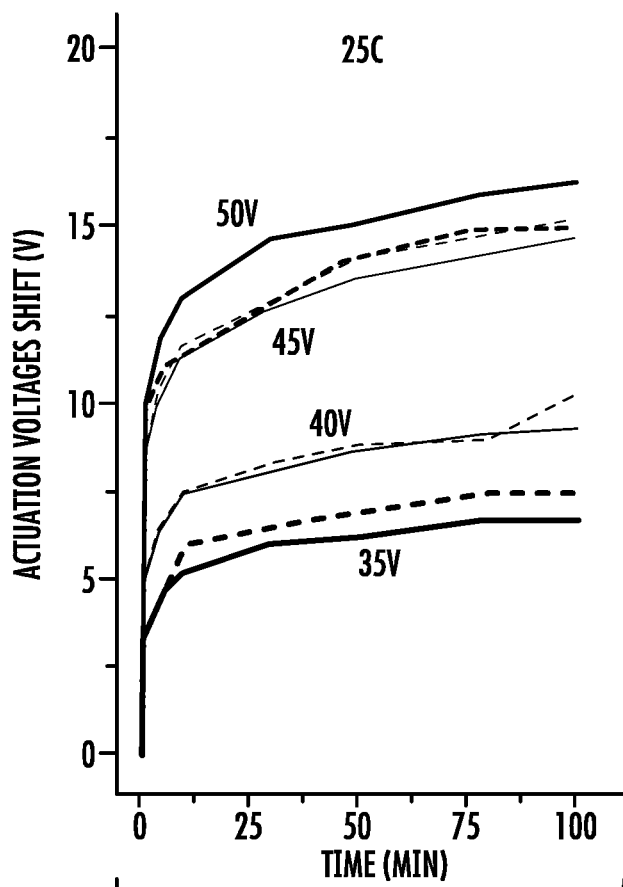
FIGS. 2a and 2b are graphs illustrating pull-in (solid lines) and release (dashed lines) voltage shifts for a conventional MEMS actuator element.
Figure 2B:
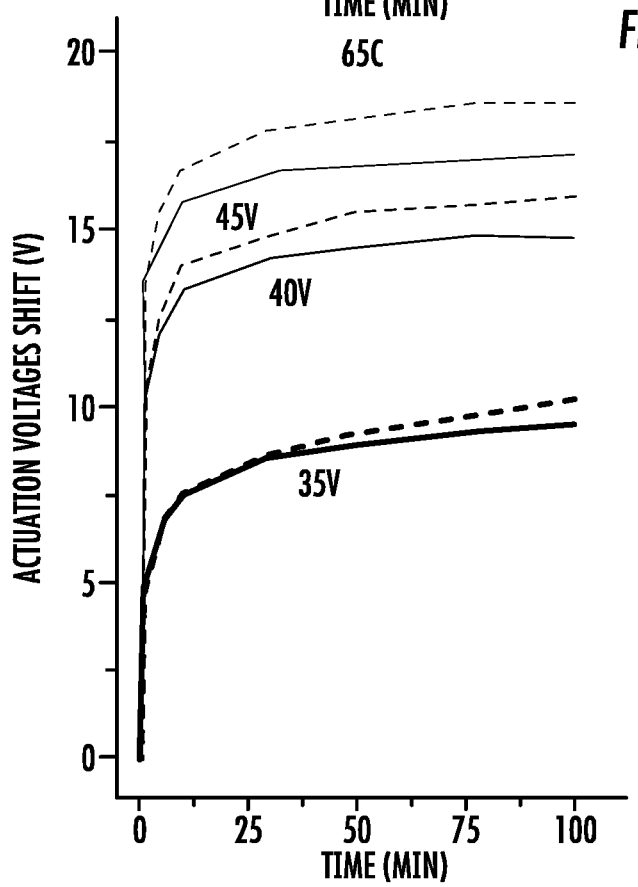

As discussed above, surface charge generation is proportional to contact area and electric field when in contact, and so the contact area can be roughly defined by the dimensions of bump 130 (although in many cases the actual contact area will be less than the bump area due to roughness, etc., and also high fields can be formed in areas that are closest to contact but not in contact). As a result, the size of bump 130 can be designed to be sufficiently small (e.g., by fabrication process or mechanical wear) to result in a reduction in charging. As shown in FIGS. 2a and 2b, for example, without bump 130, a detrimental actuation voltage shift over time can be shown.

Figure 3A:
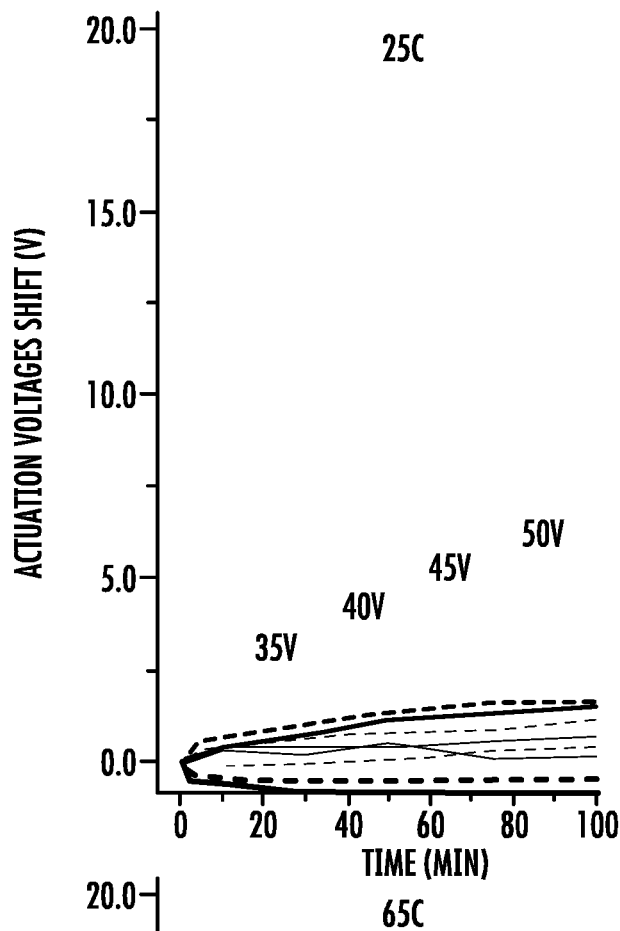
FIGS. 3a and 3b are graphs illustrating pull-in (solid lines) and release (dashed lines) voltage shifts for a MEMS actuator element having standoff bumps according to embodiments of the presently disclosed subject matter.
Figure 3B:
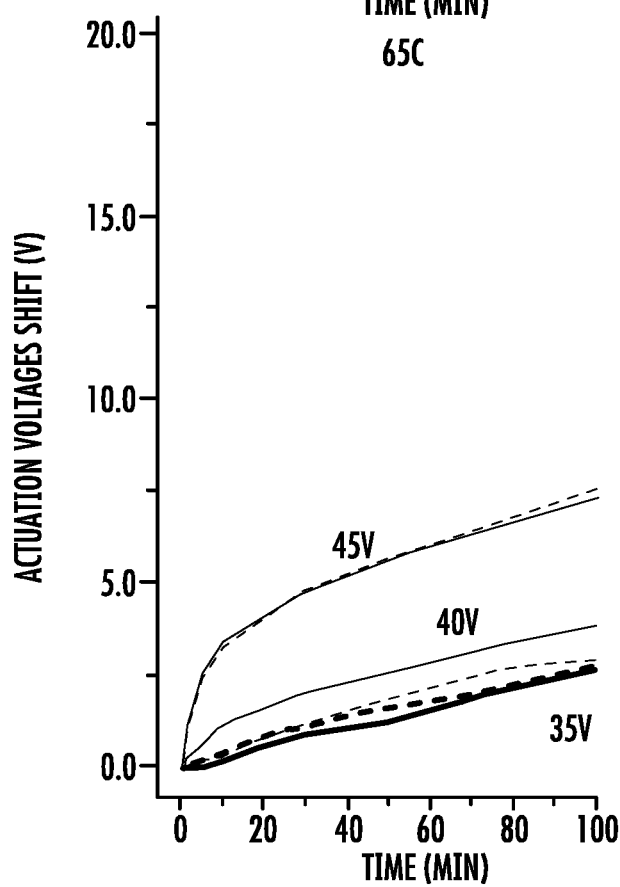

By introducing bump 130 between fixed electrode 110 and movable electrode 120, however, the voltage shift can be dramatically reduced as shown in FIGS. 3a and 3b, which demonstrate that the surface charging is reduced considerably and hence improve actuator lifetime, particularly at high temperatures. In devices having either a continuous contact surface (i.e., uniform surface with no bumps) or a discontinuous surface (i.e., with one or more bump 130), the actuation voltage shifts increase at any hold-down voltage and remain unaltered once the applied voltage is removed, providing a clear indication of surface charging and minimal or non-existent bulk charging. The transient characteristic shows a clear impact of the discontinuous contact versus the continuous contact structure, where the amount of surface charge generated has decreased notably. The two configurations show a different transient performance, with the continuous contact having a fast early build-up followed by a more gentle charging behavior, and the discontinuous contact showing a more linear increase of the surface charge. The actuation voltage shift transients also present a different behavior at elevated temperatures. The continuous contact presents less variation of the actuation voltage shift as the temperature increase, but a faster transition. On the other hand, the discontinuous contact shows a slight increase in both the final state and transition. This behavior can be attributed to two situations: first, the reduced electric field and contact delays the charging characteristic seen in the continuous devices, and second, the resulting charge distribution will modify the actuation voltage shift in a different manner.

Furthermore, in addition to reducing the contact area to minimize the surface charge generation, the electric field in the area of contact can also be minimized by the inclusion of at least one bump 130, both in the areas inside and outside of bump 130. In addition, the electric field can further be controlled by patterning one or both of fixed electrode 110 and/or movable electrode 120. In particular, referring again to the configuration shown in FIGS. 1a and 1b, movable electrode 120 can be formed to have a hole 123 therethrough that is substantially aligned with the area of bump 130 (i.e., positioned at, above, or otherwise around bump 130), and a portion of movable dielectric 122 can substantially fill hole 123. In this configuration, just as the size of bump 130 can be modified to affect the surface charge generation, the size of hole 123 can likewise be particularly sized to minimize the electric field in the area of contact and thereby result in a further reduction in charging.

Figure 4:
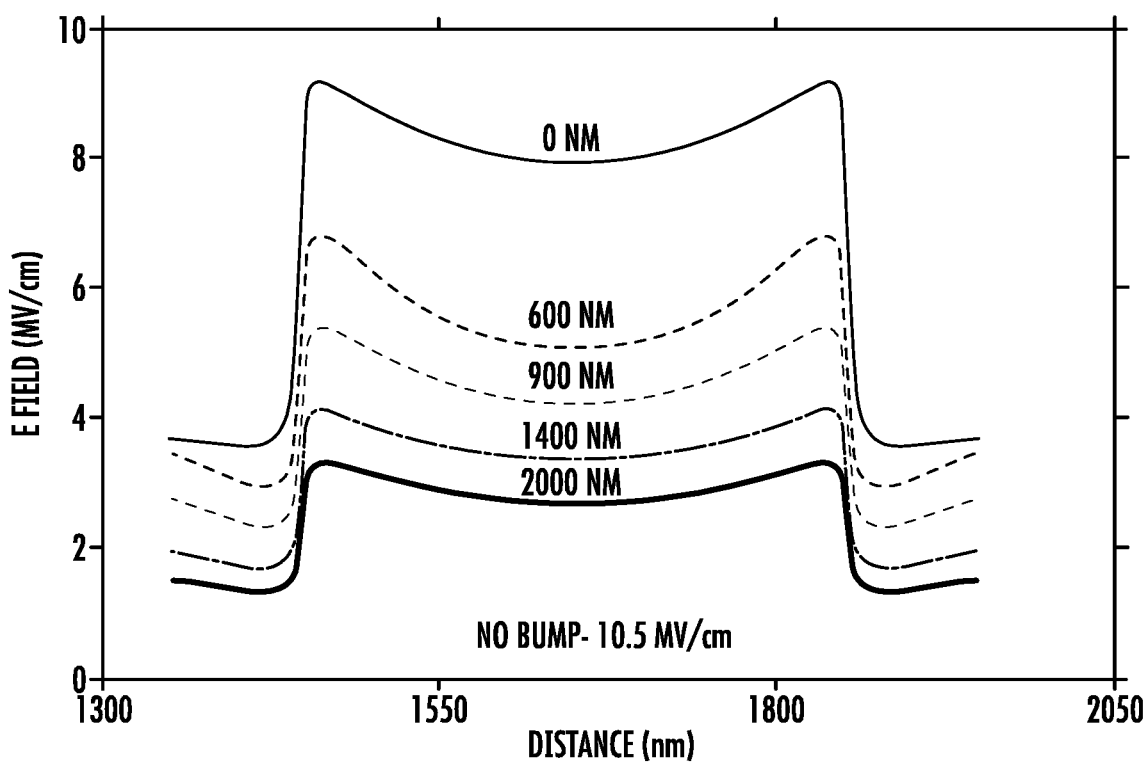
FIG. 4 is a graph illustrating surface electrostatic field strengths under standoff bumps for devices having different top metal hole diameters according to embodiments of the presently disclosed subject matter.
Figure 5:
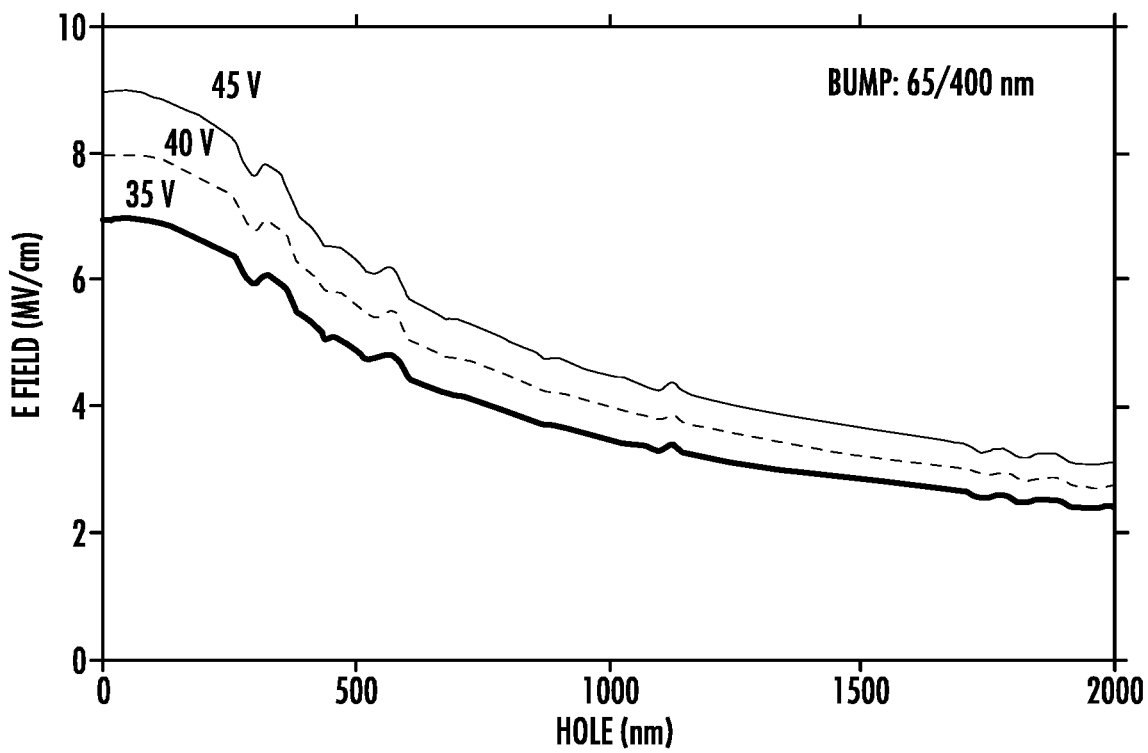
FIG. 5 is a graph illustrating center values of surface electrostatic field strength at a standoff bump as a function of different top metal hole diameters and voltages according to embodiments of the presently disclosed subject matter.

In particular, as shown in FIG. 4, the surface electrostatic field under bump 130 (i.e., at the contact surface) decreases with increasing dimensions of hole 123. Specifically, for example, for bump 130 having a width 133 of about 400 nm, the mere inclusion of bump 130 with no metal pattern (i.e., no hole 123) reduces the electrostatic field from 10.5 to 8 MV/cm, but as the metal hole diameter increases, the electrostatic field is even further reduced (e.g., to about 4 MV/cm at a hole dimension of about 1400 nm). Similarly, FIG. 5 shows the electrostatic variation as a function of the metal hole diameter under different voltages. As shown in FIG. 5, simulations have identified two clear sections in the relationship between the electrostatic field strength and the metal hole dimensions: first a fast transition from high to low field when the dimensions of hole 123 and bump 130 are comparable, and second a semi-steady-state condition when the lateral dimensions of hole 123 are larger than those of bump 130.

Based on these results, a desirable balance of reduction in the electrostatic field, reduction in contact area, and loss of metal volume in the actuators can be achieved with a metal pattern diameter of hole 123 that is sized such that the amount that hole 123 extends beyond the periphery of bump 130 (i.e., half of the difference between the dimension of hole 123 and width 133 of bump 130) is significantly larger than the minimum gap spacing in the closed state (e.g., approximately equal to the height of bump 130). In some embodiments, for example, this beneficial improvement in dielectric charging can be realized where the metal pattern diameter of hole 123 is at least three times larger than the width 133 of bump 130. That being said, those having skill in the art should recognize that even larger dimensions for hole 123 can achieve greater reductions in the electrostatic field generated, but such further changes may not provide significant benefits when balanced against the increase in actuation voltages needed when the hole area becomes comparable to maximum gap spacing 126 (e.g., about 2 µm). In other words, a desirable balance of the various factors can be achieved where the dimension of hole 123 is greater than the width 133 of bump 130 but is less than the dimension of the initial air gap 125 between fixed electrode 110 and movable electrode 120. In the particular configuration modeled to achieve the results shown in FIGS. 4 and 5, for example, a 1400 nm metal diameter for hole 123 compared against a width 133 of bump 130 of about 400 nm provided a desirable balance of factors. That being said, an upper limit for effective sizes of hole 123 can be larger for devices with a low number of holes/bumps compared to the total device dimensions. In addition, a desirable size for hole 123 can also be related to some degree to other parameters, including the thickness of movable electrode 120.

To construct MEMS actuator element 100, conventional MEMS processing methods can be used. Specifically, for example, fixed electrode 110 can be deposited on substrate S, one or more fixed dielectric layers (e.g., first fixed dielectric 112 and/or second fixed dielectric 114) can be deposited over fixed electrode 110, and a sacrificial layer can be deposited over fixed electrode 110. This sacrificial layer can be etched to define at least one standoff cavity over fixed electrode 110, and one or more movable dielectric layers (e.g., movable dielectric 122) can be deposited over the sacrificial layer, wherein at least one standoff bump 130 is defined in the at least one standoff cavity. Movable electrode 120 can then be deposited over dielectric layer 122. Movable electrode 120 can be etched to define one or more hole 123 that is substantially aligned with one or more of the at least one standoff bump 130, and one or more additional movable dielectric layer (i.e., further portions of movable dielectric 122) can be deposited to substantially fill hole 130. The sacrificial layer can then be removed to release the movable components such that movable dielectric layer 123 and movable electrode 120 are spaced apart from fixed electrode 110 by gap 125.

Figure 6A:
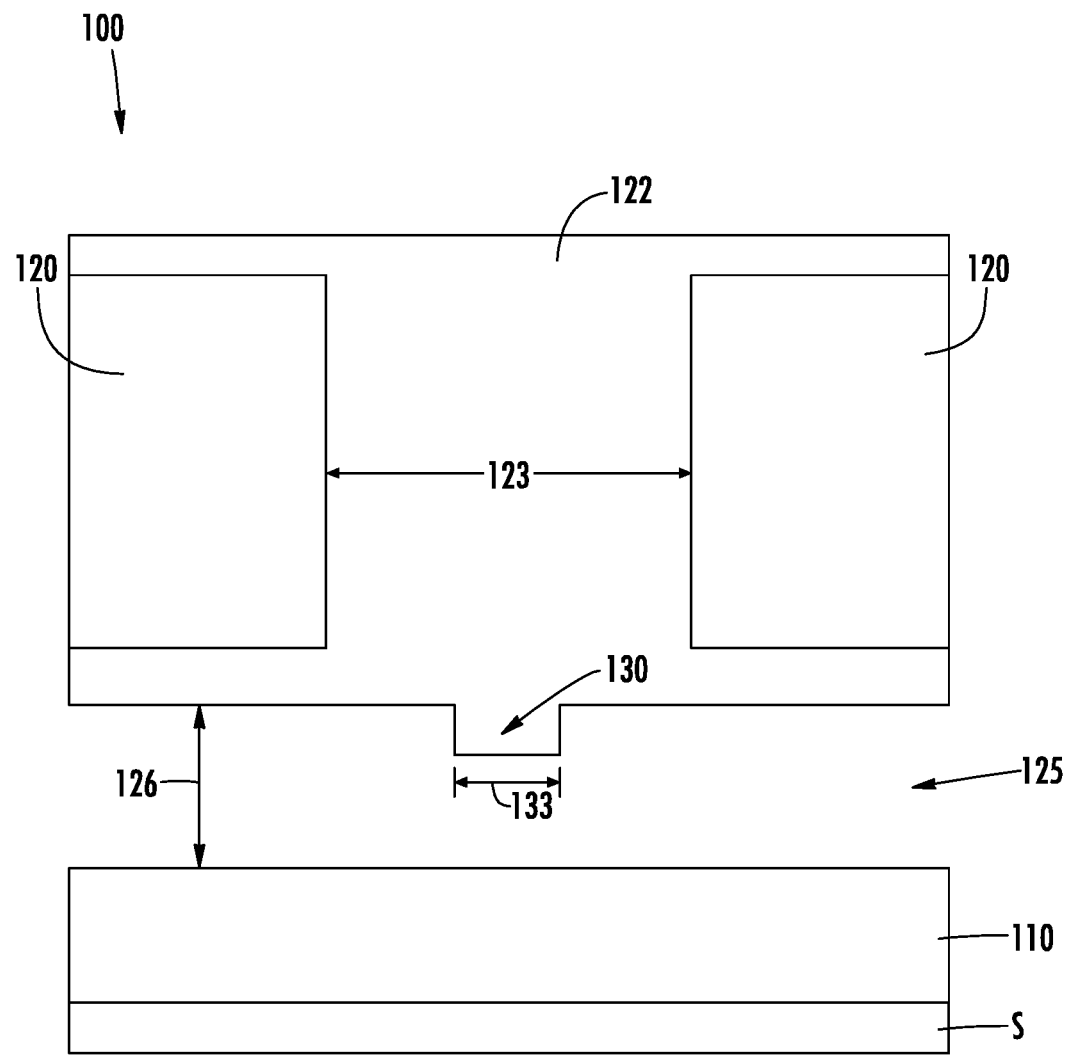
FIGS. 6a and 6b are side cutaway views of a MEMS actuator element having a standoff bump having a size relative to the surrounding material that is optimized to reduce dielectric charging according to another embodiment of the presently disclosed subject matter.
Figure 6B:
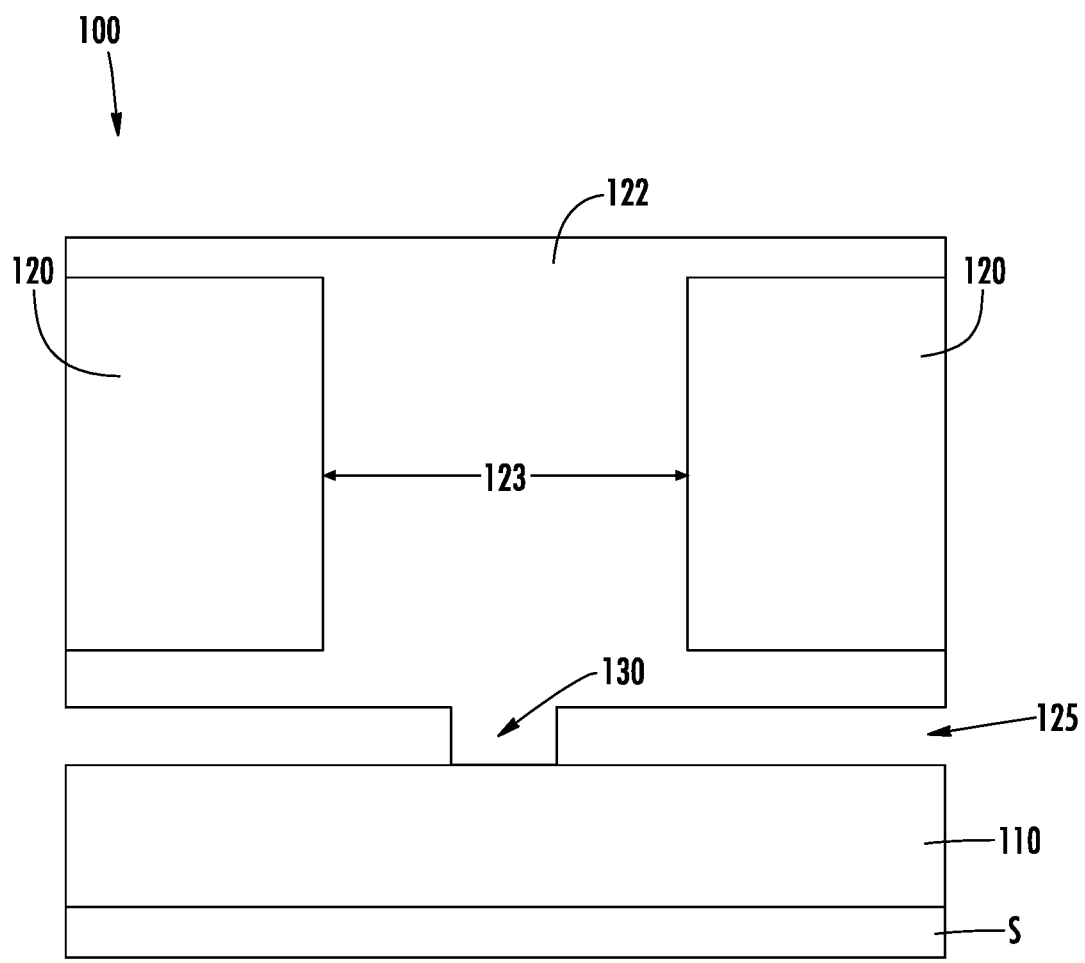
Figure 7A:
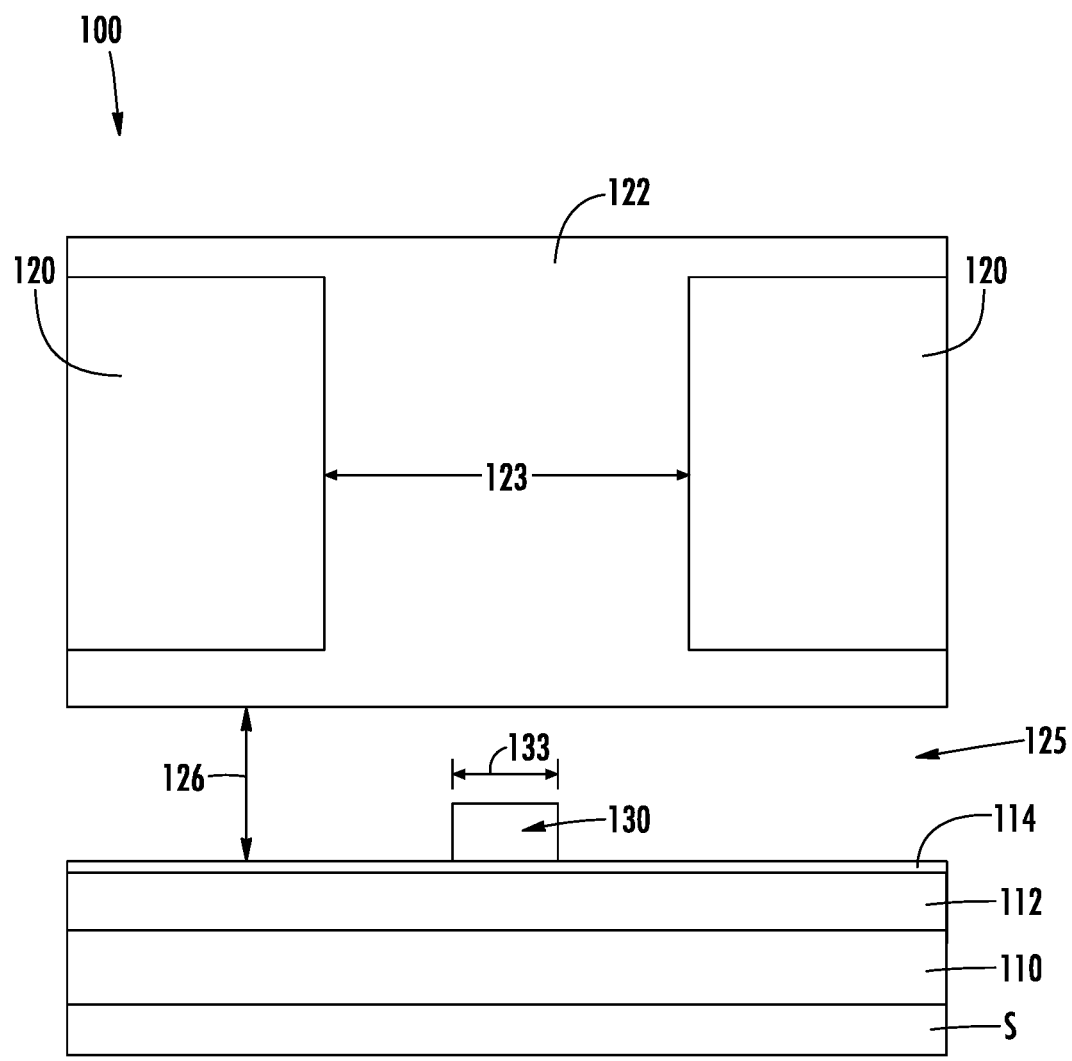
FIGS. 7a and 7b are side cutaway views of a MEMS actuator element having a standoff bump having a size relative to the surrounding material that is optimized to reduce dielectric charging according to yet another embodiment of the presently disclosed subject matter.
Figure 7B:
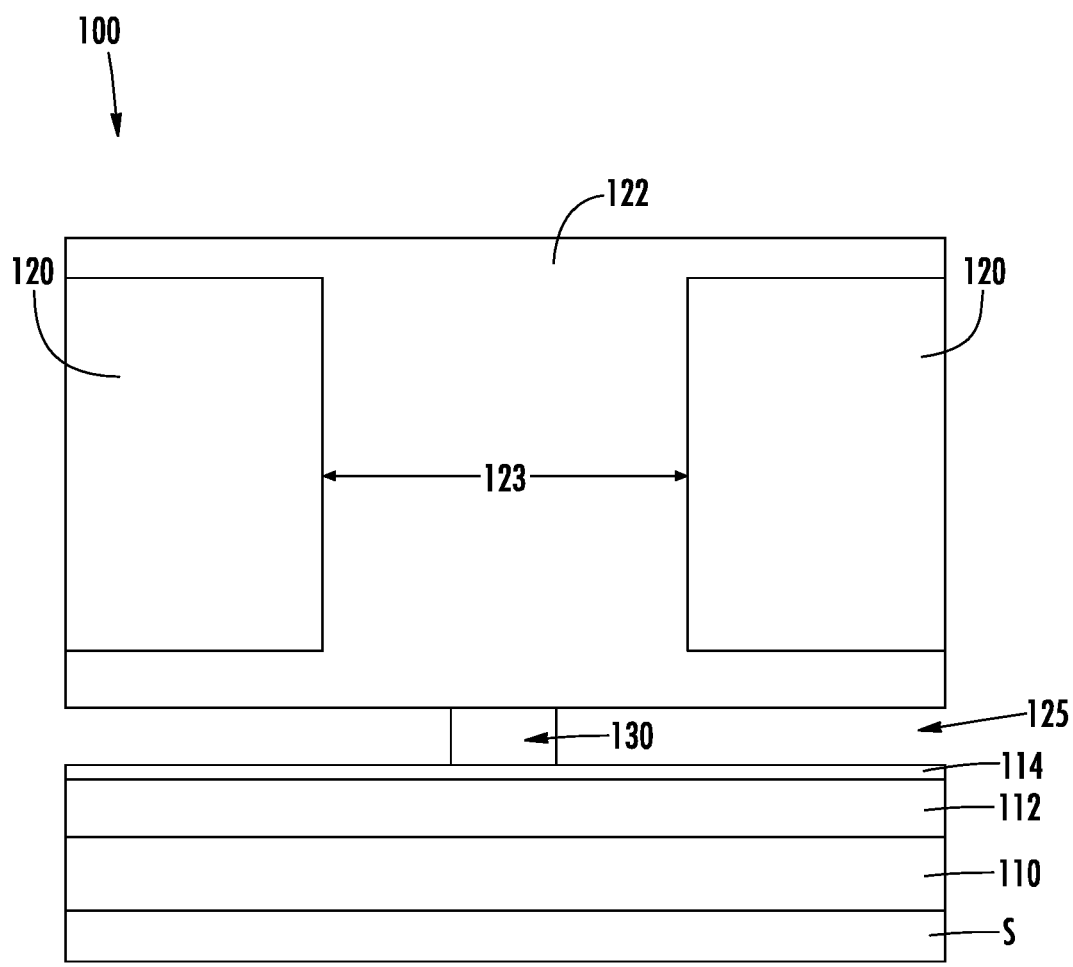

The present subject matter can be embodied in other forms without departure from the spirit and essential characteristics thereof. For example, the configuration of fixed electrode 110, movable electrode 120, and bump 130 can be modified from the configuration shown in FIGS. 1a and 1b while maintaining the features that allow for a reduction in one or both of the contact area and/or the electric field generated. In some embodiments, for example, one or more of first dielectric 112 or second dielectric 114 can be omitted such that bump 130 is configured to directly contact fixed electrode 110 as shown in FIG. 6a (unactuated state) and FIG. 6b (actuated state). In yet a further alternative configuration similar to that shown in FIGS. 6a and 6b, dielectric 122 may not extend underneath moving electrode 120. In such a configuration, only bump 130 would extend significantly below moving electrode 120. Alternatively, bump 130 can be connected to fixed electrode 110 and extend into air gap 125 towards movable electrode 120 as shown in FIG. 7a (unactuated state) and FIG. 7b (actuated state).

Figure 8A:
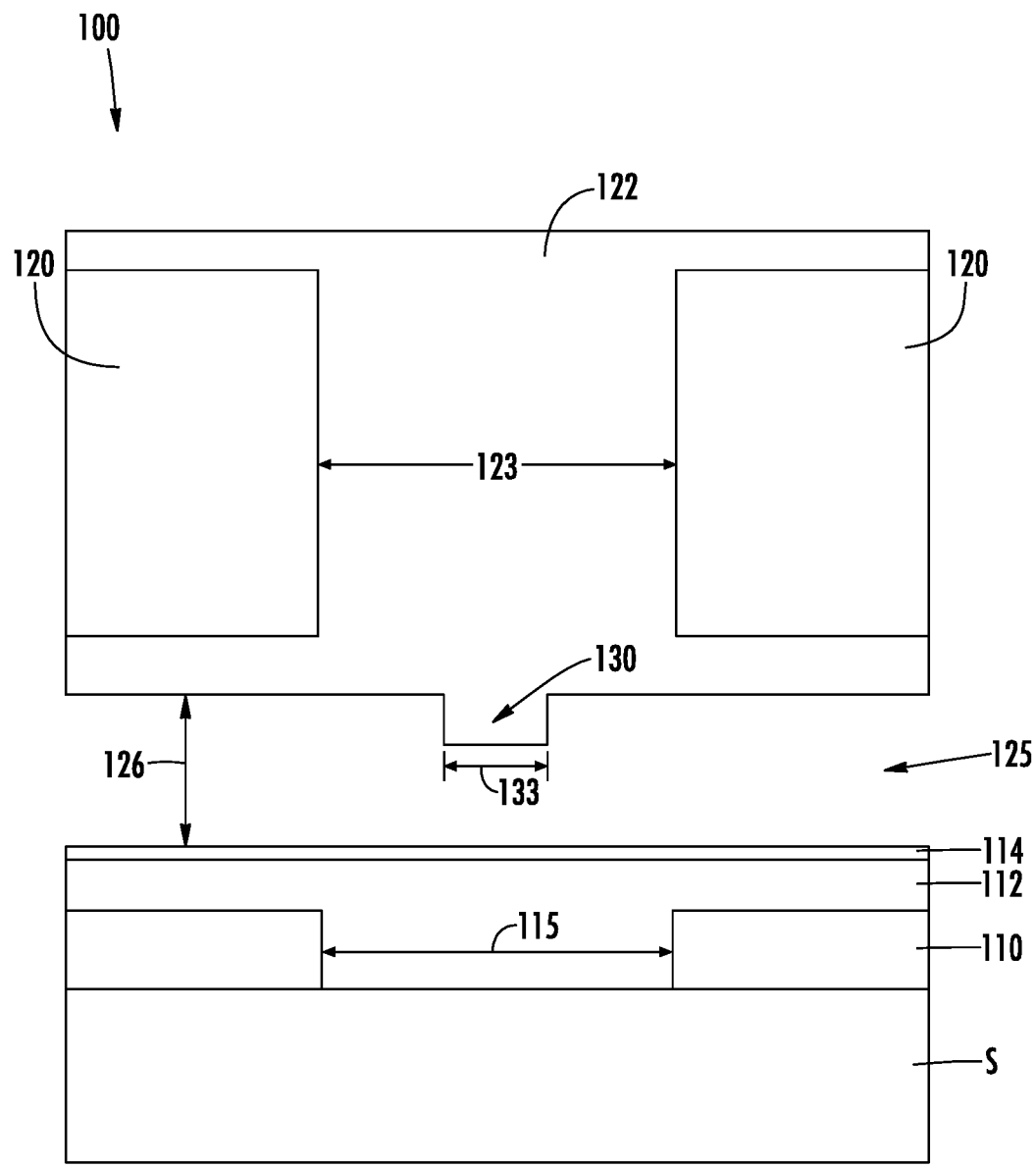
FIGS. 8a and 8b are side cutaway views of a MEMS actuator element having a standoff bump having a size relative to the surrounding material that is optimized to reduce dielectric charging according to another embodiment of the presently disclosed subject matter.
Figure 8B:
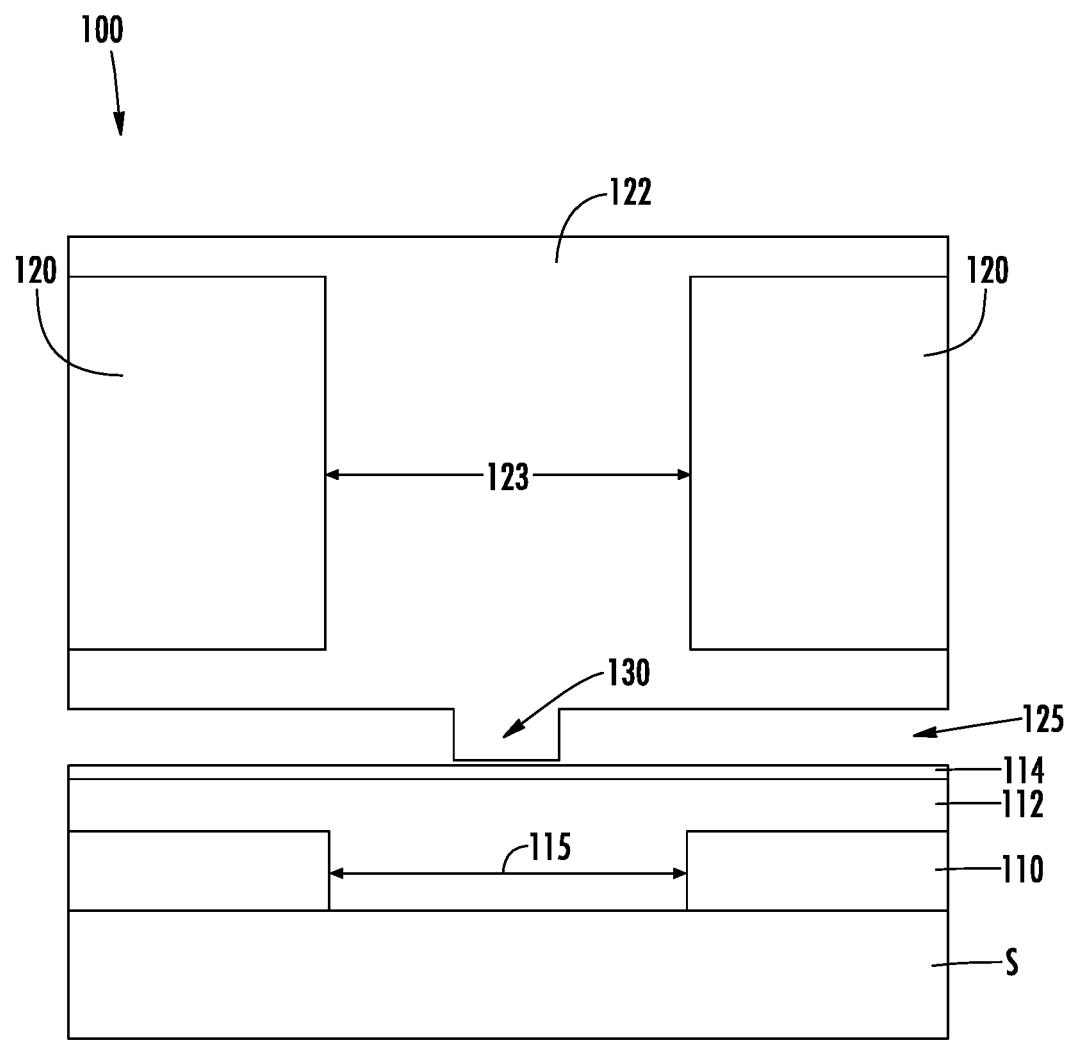
Figure 9A:
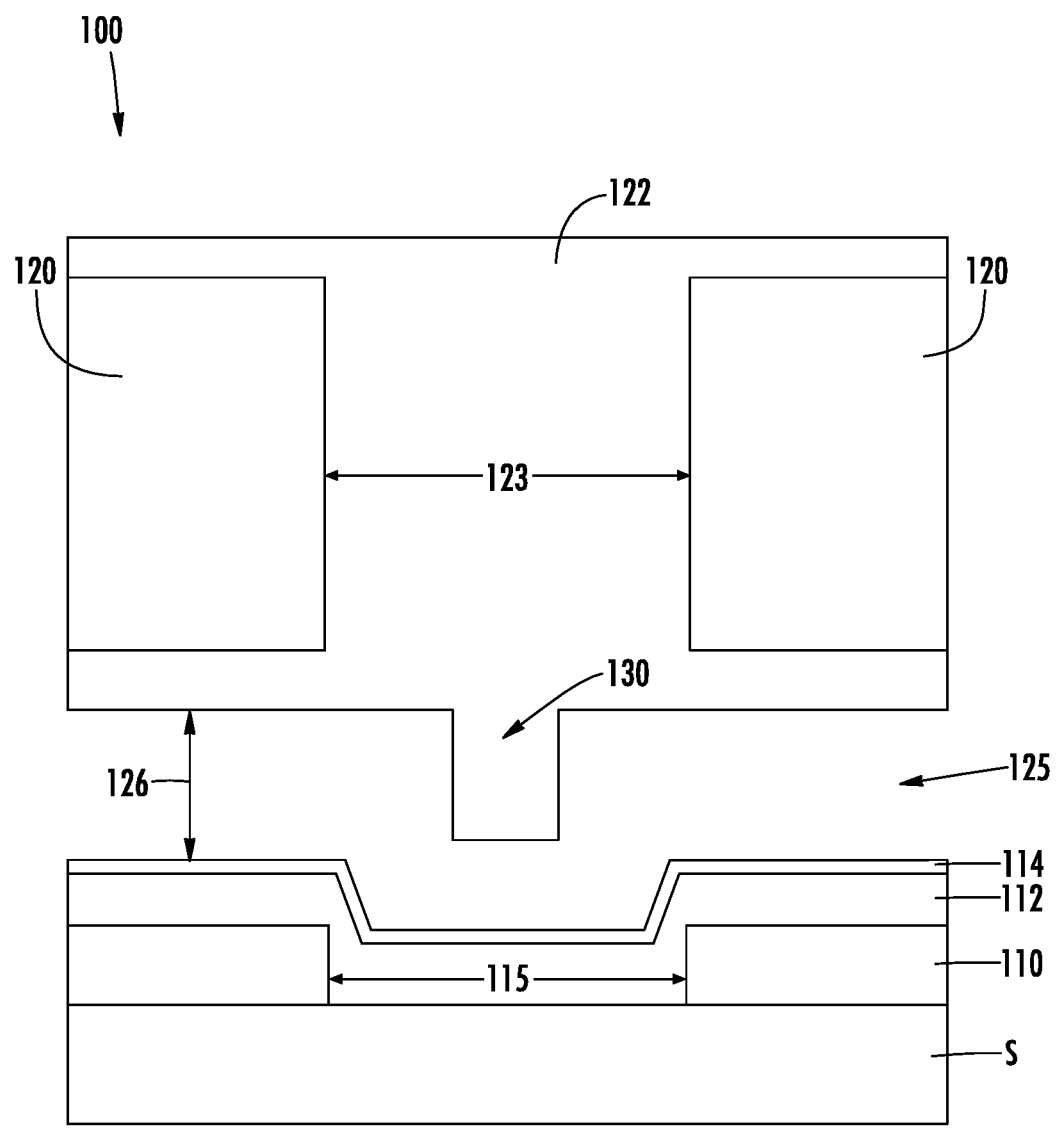
FIGS. 9a and 9b are side cutaway views of a MEMS actuator element having a standoff bump having a size relative to the surrounding material that is optimized to reduce dielectric charging according to another embodiment of the presently disclosed subject matter.
Figure 9B:
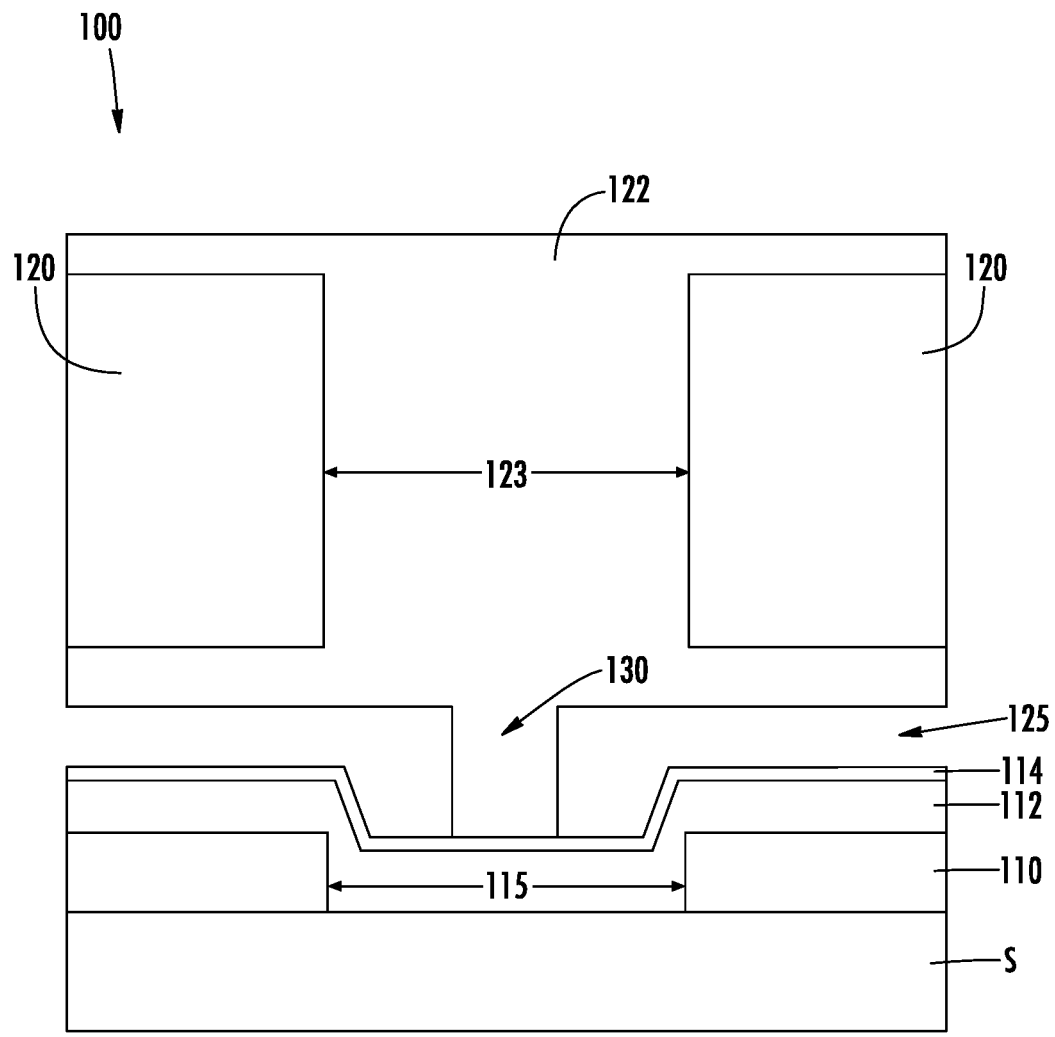

In yet a further alternative configuration, in addition to or instead of hole 123 being formed in movable electrode 120, a fixed hole 115 can be formed in fixed electrode 110 as shown in FIGS. 8a and 8b. In this configuration shown in FIGS. 8a and 8b, first dielectric 112 can both cover fixed electrode 110 and fill fixed hole 115, and this layer can then be planarized to provide a substantially uniform surface on which further layers can be deposited. Alternatively, as shown in FIGS. 9a and 9b, first dielectric 112 can be deposited as a conformal layer (i.e., not planarized). In such a configuration where fixed hole 115 creates a depression in the surface of the lower material layers, bump 130 can be sized to have a larger bump height than in previous configurations such that it extends into this depression while still maintaining the movable component layers at a desired spacing from the fixed component layers. (See, e.g., FIG. 9b) In yet a further alternative configuration similar to that shown in FIGS. 9a and 9b, first and second dielectric layers 112 and 114 can be omitted, and bump 130 can be configured to extend to substrate S when in the actuated state. Regardless of the particular configuration, the inclusion of bump 130, either alone or in combination with one or both of hole 123 and/or fixed hole 115, can advantageously reduce dielectric charging in a RF MEMS actuator element with minimal impact on actuation behavior.

Those having ordinary skill in the art will recognize that these and other embodiments are to be considered in all respects as illustrative and not restrictive, and additional variants having one or more of the elements described above are contemplated by the presently-disclosed subject matter. Although the present subject matter has been described in terms of certain preferred embodiments, other embodiments that are apparent to those of ordinary skill in the art are also within the scope of the present subject matter.

What is claimed is:

1. A micro-electro-mechanical systems (MEMS) component comprising:
    a fixed electrode positioned on a substrate;
    a moveable electrode positioned substantially above the fixed electrode and separated from the fixed electrode by a gap; and
    at least one standoff bump positioned between the fixed electrode and the moveable electrode, wherein the at least one standoff bump extends into the gap;
    wherein one or both of the fixed electrode or the moveable electrode is patterned to define one or more hole that is substantially aligned with the one or more of the at least one standoff bump; and
    wherein the one or more hole extends beyond all edges of the at least one standoff bump such that a distance between an edge of the hole and a respective edge of the at least one standoff bump is greater than or about equal to a height of the at least one standoff bump and less than or about equal to a maximum gap spacing between the fixed electrode and the movable electrode.

2. The micro-electro-mechanical systems (MEMS) component of claim 1, wherein the at least one standoff bump comprises a plurality of standoff bumps arranged in a spaced-apart arrangement between the fixed electrode and the moveable electrode.

3. The micro-electro-mechanical systems (MEMS) component of claim 2, wherein the spaced-apart arrangement comprises the plurality of standoff bumps being arranged in an array.

4. The micro-electro-mechanical systems (MEMS) component of claim 1, wherein the hole in one or both of the fixed electrode or the moveable electrode has a dimension that is larger than three times a width of the at least one standoff bump.

5. The micro-electro-mechanical systems (MEMS) component of claim 1, comprising one or more fixed dielectric material layers positioned on the fixed electrode between the fixed electrode and the movable electrode.

6. The micro-electro-mechanical systems (MEMS) component of claim 5, wherein the at least one standoff bump is connected to the one or more fixed dielectric material layers.

7. The micro-electro-mechanical systems (MEMS) component of claim 1, comprising one or more movable dielectric material layers attached to the movable electrode between the fixed electrode and the movable electrode.

8. The micro-electro-mechanical systems (MEMS) component of claim 7, wherein the at least one standoff bump is connected to the one or more movable dielectric material layers.

9. A micro-electro-mechanical systems (MEMS) component comprising:
    a fixed electrode positioned on a substrate;
    a moveable electrode positioned substantially above the fixed electrode and separated from the fixed electrode by a gap; and
    at least one standoff bump positioned between the fixed electrode and the moveable electrode, wherein the at least one standoff bump extends into the gap;
    wherein the moveable electrode is patterned to define one or more hole that is substantially aligned with one or more of the at least one standoff bump, the hole having a dimension that is larger than a width of the at least one standoff bump but smaller than a maximum gap spacing between the fixed electrode and the movable electrode; and
    wherein an amount that the one or more hole extends beyond a periphery of the at least one standoff bump is significantly larger than a minimum gap spacing between the fixed electrode and the movable electrode.

10. The micro-electro-mechanical systems (MEMS) component of claim 9, wherein the at least one standoff bump comprises a plurality of standoff bumps arranged in a spaced-apart arrangement between the fixed electrode and the moveable electrode.

11. The micro-electro-mechanical systems (MEMS) component of claim 9, comprising one or more fixed dielectric material layers positioned on the fixed electrode between the fixed electrode and the movable electrode.

12. The micro-electro-mechanical systems (MEMS) component of claim 11, wherein the at least one standoff bump is connected to the one or more fixed dielectric material layers.

13. The micro-electro-mechanical systems (MEMS) component of claim 9, comprising one or more movable dielectric material layers attached to the movable electrode between the fixed electrode and the movable electrode.

14. The micro-electro-mechanical systems (MEMS) component of claim 13, wherein the at least one standoff bump is connected to the one or more movable dielectric material layers.

15. The micro-electro-mechanical systems (MEMS) component of claim 9, wherein the hole in the moveable electrode has a dimension that is larger than three times a width of the at least one standoff bump.

16. A method for forming a micro-electro-mechanical systems (MEMS) component, the method comprising:
depositing a fixed electrode on a substrate;
depositing a sacrificial layer over the fixed electrode;
etching the sacrificial layer to define at least one standoff cavity over the fixed electrode;
depositing one or more movable dielectric layers over the sacrificial layer, wherein at least one standoff bump is defined in the at least one standoff cavity;
depositing a movable electrode over the one or more movable dielectric layers;
etching the movable electrode to define one or more hole that is substantially aligned with one or more of the at least one standoff bump; and
removing the sacrificial layer such that the one or more movable dielectric layers and the movable electrode are spaced apart from the fixed electrode by a gap;
wherein an amount that the one or more hole extends beyond a periphery of the at least one standoff bump is significantly larger than a minimum gap spacing between the fixed electrode and the movable electrode.

17. The method of claim 16, wherein etching the movable electrode to define one or more hole comprises etching the movable electrode to define one or more hole having a dimension that is smaller than a maximum gap spacing between the fixed electrode and the movable electrode after removing the sacrificial layer.

18. The method of claim 16, wherein etching the movable electrode to define one or more hole comprises etching the movable electrode to define a plurality of holes in a spaced-apart arrangement over the fixed electrode.

19. The method of claim 16, comprising depositing one or more fixed dielectric layers over the fixed electrode prior to depositing the sacrificial layer.

20. The method of claim 16, comprising depositing one or more additional movable dielectric layer to substantially fill the one or more hole.

21. The method of claim 16, wherein the hole in the moveable electrode has a dimension that is larger than three times a width of the at least one standoff bump.

* * * * *